United States Patent
Chapin et al.

(10) Patent No.: US 12,310,086 B2
(45) Date of Patent: May 20, 2025

(54) MONOLITHIC GROWTH OF EPITAXIAL SILICON DEVICES VIA CO-DOPING

(71) Applicants: Lawrence Livermore National Security, LLC, Livermore, CA (US); the United States of America as represented by the Secretary of the Army, Huntsville, AL (US); BAE Systems Land & Armaments L.P., Sterling Heights, MI (US)

(72) Inventors: Caitlin Anne Chapin, Fremont, CA (US); Lars F. Voss, Livermore, CA (US); Luis M. Hernandez, Coon Rapids, MN (US); Mark Rader, Decatur, AL (US)

(73) Assignees: Lawrence Livermore National Security, LLC., Livermore, CA (US); the United States of America as represented by the Secretary of the Army, Huntsville, AL (US); BAE Systems Land & Armaments L.P., Sterling Heights, MI (US)

( * ) Notice: Subject to any disclaimer, the term of this patent is extended or adjusted under 35 U.S.C. 154(b) by 151 days.

(21) Appl. No.: 17/967,754

(22) Filed: Oct. 17, 2022

(65) Prior Publication Data
US 2023/0121080 A1    Apr. 20, 2023

Related U.S. Application Data

(60) Provisional application No. 63/257,006, filed on Oct. 18, 2021.

(51) Int. Cl.
*H10D 8/25*    (2025.01)
*H10D 8/01*    (2025.01)

(52) U.S. Cl.
CPC .............. *H10D 8/25* (2025.01); *H10D 8/053* (2025.01)

(58) Field of Classification Search
None
See application file for complete search history.

(56) References Cited

U.S. PATENT DOCUMENTS

| | | | |
|---|---|---|---|
| 5,148,267 A * | 9/1992 | Ty Tan | H01L 29/868 257/199 |
| 2013/0093066 A1 * | 4/2013 | Tsukuda | H01L 29/32 257/656 |

(Continued)

OTHER PUBLICATIONS

Pfiester et al., "Anomalous co-diffusion effects of germanium on group III and V dopants in silicon," Applied Physics Letters, vol. 52, Aug. 4, 1998, pp. 471-473.

(Continued)

*Primary Examiner* — Khaja Ahmad
(74) *Attorney, Agent, or Firm* — Zilka-Kotab, P.C.

(57) ABSTRACT

In one general embodiment, a structure includes a first diode, comprising: a first layer having a first type of dopant, and a second layer above the first layer, the second layer having a second type of dopant that is opposite to the first type of dopant. A second diode is formed directly on the first diode. The second diode comprises a first layer having a third type of dopant and a second layer above the first layer of the second diode, the second layer of the second diode having a fourth type of dopant that is opposite to the third type of dopant. In another general embodiment, a process includes a repeated sequence of growing a first layer having a first type of electrically active dopant and growing a second layer having a second type of electrically active dopant that is opposite to the first type of dopant.

20 Claims, 5 Drawing Sheets

(56) References Cited

U.S. PATENT DOCUMENTS

| | | | |
|---|---|---|---|
| 2013/0270514 A1* | 10/2013 | Saxler .................. | H10D 89/601 |
| | | | 257/E29.105 |
| 2015/0243757 A1* | 8/2015 | Tani .................... | H01L 27/0262 |
| | | | 438/140 |
| 2021/0118946 A1* | 4/2021 | Simon .................. | H01L 25/167 |
| 2021/0126136 A1 | 4/2021 | Voss et al. | |
| 2022/0013678 A1* | 1/2022 | Meusel ............... | H01L 31/0735 |

OTHER PUBLICATIONS

Rucker et al., "Suppressed diffusion of boron and carbon in carbon-rich silicon," Applied Physics Letters, vol. 73, Sep. 16, 1998, 4 pages.

Pawlak et al., "Effect of amorphization and carbon codoping on activation and diffusion of boron in silicon," Applied Physics Letters, vol. 89, Aug. 11, 2006, 4 pages.

Ku et al., "Effects of germanium and carbon coimplants on phosphorus diffusion in silicon," Applied Physics Letters, vol. 89, 2006, 3 pages.

Wikipedia, "Step recovery diode," Wikipedia, 2022, 4 pages, retrieved from https://en.wikipedia.org/wiki/Step_recovery_diode.

Wikipedia, "Zener diode," Wikipedia, 2022, 7 pages, retrieved from https://en.wikipedia.org/wiki/Zener_diode.

Roshni Y., "Zener Diode," Electronics Desk, 2022, 8 pages, retrieved from https://electronicsdesk.com/zener-diode.html.

* cited by examiner

MONOLITHIC GROWTH OF EPITAXIAL SILICON DEVICES VIA CO-DOPING

RELATED APPLICATION

This application claims priority to U.S. Provisional Patent Appl. No. 63/257,006, filed Oct. 18, 2021, and which is incorporated by reference.

This invention was made with Government support under Contract No. DE-AC52-07NA27344 awarded by the United States Department of Energy. The Government has certain rights in the invention.

FIELD OF THE INVENTION

The present invention relates to semiconductor devices such as diodes, and more particularly, this invention relates to silicon devices having co-doped layers, thereby providing sharp, narrow junctions.

BACKGROUND

Among the great challenges of materials science is discovering a material that satisfies conflicting requirements and also possesses specific properties for a particular application. This is especially true when attempting to create complex electronic components where different materials interface with each other. Such interface should provide a desired result, or conversely, should not adversely affect the electronic component.

Consider stacked diodes, for example. A diode is a two-terminal electronic component that conducts current primarily in one direction. A diode has low resistance in one direction, and high resistance in the other. A semiconductor junction diode is typically made of a crystal of semiconductor, usually silicon. Impurities are added to create a region on one side that includes negative charge carriers, called an N-type semiconductor. A region on the other side that includes positive charge carriers is called a P-type semiconductor. The boundary between these two regions is called a P-N junction where a depletion region is formed having a depletion width. When a sufficiently higher electrical potential is applied to the P side (the anode) than to the N side (the cathode), the potential allows electrons to flow through the depletion region from the N-type side to the P-type side.

Growth of low voltage monolithic tunnel and Zener diodes via epitaxy is challenging. Sharp junctions with highly degenerate doping on both sides is required for all tunneling diodes and Zener diodes with a low Zener voltage. At elevated temperatures, the doped regions tend to diffuse into each other, reducing the abrupt changes from p-type to n-type and reducing the degeneracy. This in turn prevents fabrication of stacked structures. The ability to epitaxially grow these structures would be desirable because it would enable fabrication of complex multilayer stacks. However, the diffusion problem has heretofore prevented successful implementation of structures having such multilayer stacks, especially via high temperature epitaxial growth.

BRIEF SUMMARY

A structure, in accordance with one embodiment, includes a first diode, comprising: a first layer having a first type of dopant, and a second layer above the first layer, the second layer having a second type of dopant that is opposite to the first type of dopant. A second diode is formed directly on the first diode. The second diode comprises a first layer having a third type of dopant and a second layer above the first layer of the second diode, the second layer of the second diode having a fourth type of dopant that is opposite to the third type of dopant.

A process, in accordance with one embodiment, includes growing a first layer having a first type of electrically active dopant. A second layer having a second type of electrically active dopant that is opposite to the first type of dopant is grown, thereby forming a first diode. The growing steps are repeated at least one time for forming at least one additional diode above the first diode.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a structure includes a first diode, comprising: a first layer having a first type of dopant, and a second layer above the first layer, the second layer having a second type of dopant that is opposite to the first type of dopant. A second diode is formed directly on the first diode. The second diode comprises a first layer having a third type of dopant and a second layer above the first layer of the second diode, the second layer of the second diode having a fourth type of dopant that is opposite to the third type of dopant.

In another general embodiment, a process includes growing a first layer having a first type of electrically active dopant. A second layer having a second type of electrically active dopant that is opposite to the first type of dopant is grown, thereby forming a first diode. The growing steps are repeated at least one time for forming at least one additional diode above the first diode.

The term "dopant" as used in the instant descriptions shall be understood to encompass any element or compound that is included in a host medium material, so as to convey a particular functional characteristic or property on the resulting structure. In most cases, the dopant will be incorporated into a crystal structure of the host medium material.

Various aspects of the present invention utilize co-doping of materials to inhibit diffusion of the desired dopants. Without wishing to be bound by any theory, it is presently believed that the co-dopants occupy point defects (e.g., interstitials, substitutions) that the electrically active dopant would otherwise use to diffuse into the material. By leveraging co-doping during epitaxial growth, higher growth temperatures become practical and complex multilayered structures are now possible.

The following disclosure describes the monolithic growth of epitaxial co-doped devices requiring sharp and narrow junctions, such as tunnel diodes, Zener diodes, and tunneling Drift Step Recovery Diodes (tunneling DSRDs).

Introduction to Tunnel Diodes, Zener Diodes and DSRDs

Tunnel diodes require sharp, narrow junctions for proper tunneling to occur. The wider the depletion width, the less tunneling will occur. Likewise, Zener diodes with low Zener voltages require tunneling in the reverse direction and thus sharp junctions. An example of such co-doping is adding carbon to boron-doped silicon. Tunneling DSRDs require multiple layers of N/I/P regions to be grown. As described in more detail below, sharp, narrow junctions are grown by co-doping electrically inactive dopants with electrically active dopants. The new co-doping described herein enables complex structures to be grown.

A Zener diode is a special type of diode designed to reliably allow current to flow "backwards" when a certain set reverse voltage, known as the Zener voltage, is reached. Zener diodes are manufactured with a great variety of Zener voltages. Some Zener diodes are variable. Zener diodes of particular interest here have a sharp, highly doped p-n junction with a low Zener voltage, in which case the reverse conduction occurs due to electron quantum tunnelling in the short space between p and n regions. This is known as the Zener effect. Diodes with a higher Zener voltage have a more gradual junction and their mode of operation also involves avalanche breakdown. Both breakdown types are present in Zener diodes with the Zener effect predominating at lower voltages and avalanche breakdown at higher voltages.

Zener diodes are widely used in electronic equipment of all kinds, and are one of the basic building blocks of electronic circuits. For example, they are used to generate low-power stabilized supply rails from a higher voltage and to provide reference voltages for circuits, especially stabilized power supplies. They are also used to protect circuits from overvoltage, especially electrostatic discharge (ESD).

A Step Recovery Diode (SRD) is a semiconductor junction diode having the ability to generate extremely short pulses. The SRD has a variety of uses in microwave electronics as pulse generator or parametric amplifier. The Drift Step Recovery Diode (DSRD) was developed for pulsed power applications. The principle of the DSRD operation is similar to the SRD, except that the forward pumping current is pulsed instead of continuous. A short pulse of current is applied in the forward direction of the DSRD effectively charging the P-N junction capacitively. When the current direction reverses, the accumulated charges are removed from the base region. As soon as the accumulated charge decreases to zero, the diode opens rapidly. A high voltage spike can appear due to the self-induction of the diode circuit. The larger the commutation current and the shorter the transition from forward to reverse conduction, the higher the pulse amplitude and efficiency of the pulse generator.

DSRDs are commonly made of silicon diodes. Other materials, such as gallium arsenide (GaAs) and silicon carbide (SiC), can be used for DSRD as well. The fabrication of DSRDs typically involves deep diffusion of N-type and P-type dopants into a moderately doped silicon wafer to create a PIN diode (a diode that has a P-doped region, an intrinsic (I) region, and an N-doped region). The thickness of the I-region is typically in the range of 5 to 50 microns. This thickness is determined based on the speed of the pulse required: narrower regions produce faster pulses but lower peak voltage. In many cases, as part of the fabrication of the device, the diffusion of the dopants can take over a week, resulting in difficulties in controlling the thickness of the I region.

Once individual diodes are produced, they are stacked in series to provide a desired function. For example, DSRD diodes may be stacked to produce the required peak voltage pulse for a desired application. Stacking of the individual diodes is often performed using die attachment techniques, such as soldering, eutectic bonding, metal diffusion bonding, etc., which require an intermediate metal layer to bond the diodes. However, the addition of the metal layer results in higher contact resistance between individual diodes, as well as voids at the interface, leading to deleterious performance.

Inventive Structures and Techniques

The following description discloses, among other features and benefits, multi-layer diodes and methods for producing the same, without using any intermediate metallic layers, thereby eliminating problems associated with stacking of such diodes, including voids or other irregularities at the interface of adjacent diodes. Instead of producing individual layers and then bonding the diodes at the metallic layers, the entire stack of multi-layer diodes can be formed on a substrate. In some exemplary embodiments, the entire stack can be grown epitaxially on a silicon wafer. Epitaxial growth is a type of crystal growth or material deposition in which new crystalline layers are formed with a defined orientation with respect to the substrate. The grown structure can have different regions that follow one another, such as N/I/P/N/I/P/N/I/P or P/I/N/P/I/N/P/I/N structures, in which each group of N/I/P or P/I/N regions forms an individual diode. Growing the entire stack provides better control of the layer thickness and reduces the fabrication time as compared to the diffusion process. The fabrication cost can also be greatly reduced to around $10-$150 per die as compared to around $500-$1000 or more per die using conventional techniques.

In various approaches, a stack of diodes is created. In some approaches, the stack of diodes includes several diodes formed in a stack. As noted above, the grown structure can have different regions that follow one another, such as N/I/P/N/I/P/N/I/P or P/I/N/P/I/N/P/I/N structures, in which each group of N/I/P or P/I/N regions forms an individual diode.

The bulk material of each layer is preferably a semiconductor such as silicon or other conventional semiconductor material. All of the layers may be formed of the same semiconductor, or the semiconductor material may be different in one or more of the layers. The layers may be grown by conventional processing techniques, but modified as set forth herein to achieve a sharp and narrow junction.

The layers may be grown epitaxially on a substrate, such as a silicon wafer. A seed layer may be present on the substrate to define the epitaxial growth. The type and composition of seed layer may be selected to provide the desired epitaxial growth, in a manner that would become apparent to one skilled in the art upon reading the present disclosure.

The first type of dopant may be P-type dopant while the second type of dopant is N-type dopant. Alternatively, the first type of dopant may be N-type dopant while the second type of dopant is P-type dopant. Any conventional dopants may be used, including those listed elsewhere herein. Moreover, in preferred embodiments, first type of dopant is the same in all diodes in the stack, and the second type of dopant is the same in all diodes in the stack. However, in other embodiments, one or more layers of one or more diodes in a stack may have a different dopant(s) than similar layers in the other diodes in the stack.

In some embodiments, the stack of diodes includes at least one tunneling diode. See, e.g., FIGS. 3 and 5, described in more detail below. Each diode includes a first layer having a first type of electrically active dopant, optionally an intermediate layer forming a region (e.g., an intrinsic region) with at least ten times lower concentration of dopant (e.g., average concentration in the entire volume thereof) compared to adjacent layers thereto measured in the same way, and thereabove a second layer having a second type of electrically active dopant that is opposite to the first type of dopant. At least the layers that form the junction between diodes further include an electrically inactive co-dopant. Thus, for example, the first layer of a second diode is positioned on top of the second layer of a first diode and includes an electrically active dopant and an electrically inactive co-dopant, which again may be the same or different dopant(s) than in the second layer of the first diode. The first layer of the second diode and the second layer of the first diode are degenerate to form a tunneling diode at an interface of the first diode and the second diode.

In some embodiments, the first layer of the second diode comprises a degenerate P-type region and the second layer of the first diode comprises a degenerate N-type region. In some embodiments, the second layer of the second diode comprises a N-type region and the first layer of the first diode comprises a P-type region. Note however that if a third diode is formed above the second diode, the second layer of the second diode may comprise a degenerate N-type region, and the first layer of the third diode may comprise a degenerate P-type region, and so on for additional diodes in the stack. The second layer of the uppermost diode may include an N-type region. Note also that if the particular type of diodes being created do not have an intermediate layer, then the second layer described here would be formed on the first layer of each diode to form a bi-layer diode (and likewise in similar embodiments described elsewhere herein).

In some embodiments, the first layer of the second diode comprises a degenerate N-type region and the second layer of the first diode comprises a degenerate P-type region. In some embodiments, the second layer of the second diode comprises a P-type region and the first layer of the first diode comprises a N-type region. Note however that if a third diode is formed above the second diode, the second layer of the second diode may comprise a degenerate P-type region, and the first layer of the third diode may comprise a degenerate N-type region, and so on for additional diodes in the stack.

In some embodiments, the tunneling diode is doped at an average doping concentration of electrically active dopant in a range of $1\times10^{18}$ cm$^{-3}$ to $1\times10^{20}$ cm$^3$. In some embodiments, the tunneling diode is doped at an average doping concentration of electrically active dopant higher than $5\times10^{19}$ cm$^{-3}$. In some embodiments, the co-doped layer(s) of each tunneling diode has an average doping concentration of the electrically inactive dopant in one or more layers of at least $1\times10^{19}$ cm$^{-3}$ and preferably higher than $1\times10^{20}$ cm$^3$. In some embodiments, the tunneling diode has a reverse breakdown voltage equal to or lower than 200 meV. In some embodiments, each of the at least two diodes is operable to turn on at a voltage between 650 meV to 750 meV, and the tunneling diode is operable to break down at a voltage between 180 meV to 250 meV. In other approaches, the turn on voltage is above or below the aforementioned range; and/or the breakdown voltage is above or below the aforementioned range.

In one exemplary aspect, the stack of diodes includes at least two drift step recovery diodes (DSRDs). Each DSRD includes a first layer having a first type of dopant, an intermediate layer forming a region with at least ten times lower concentration of dopants compared to adjacent layers thereto, and a second layer above the intermediate layer and having a second type of dopant that is opposite to the first type of dopant, and further includes an electrically inactive co-dopant. The first layer of a second DSRD is positioned on top of the second layer of a first DSRD and includes an electrically active dopant and an electrically inactive co-dopant. The first layer of the second DSRD and the second layer of the first DSRD are degenerate to form a tunneling diode at an interface of the first DSRD and the second DSRD. The tunneling diode may demonstrate a linear current-voltage characteristic.

In some embodiments, the first layer of the second DSRD comprises a degenerate P-type region and the second layer of the first DSRD comprises a degenerate N-type region. Accordingly, the second layer of the second DSRD may comprise an N-type region and the first layer of the first DSRD comprises a P-type region. Note however that if a third DSRD is formed above the second DSRD, the second layer of the second DSRD may comprise a degenerate N-type region, and the first layer of the third DSRD may comprise a degenerate P-type region, and so on for additional diodes in the stack.

In some embodiments, the first layer of the second DSRD comprises a degenerate N-type region and the second layer of the first DSRD comprises a degenerate P-type region. Accordingly, the second layer of the second DSRD may comprise a P-type region and the first layer of the first DSRD comprises an N-type region. Note however that if a third DSRD is formed above the second DSRD, the second layer of the second DSRD may comprise a degenerate P-type region, and the first layer of the third DSRD may comprise a degenerate N-type region, and so on for additional diodes in the stack.

In another exemplary aspect, the stack of diodes includes at least two Zener diodes. Each Zener diode includes a first layer having a first type of dopant, and a second layer having a second type of dopant that is opposite to the first type of dopant, and further includes an electrically inactive co-dopant. The first layer of a second Zener diode is positioned on top of the second layer of a first Zener diode and includes an electrically active dopant and an electrically inactive co-dopant. The first layer of the second Zener diode and the second layer of the first Zener diode are degenerate to form a tunneling diode at an interface of the first Zener diode and the second Zener diode. See, e.g., FIG. 5 and related description below.

In some embodiments, the first layer of the second Zener diode comprises a degenerate P-type region and the second layer of the first Zener diode comprises a degenerate N-type region. Accordingly, the second layer of the second Zener diode may comprise an N-type region and the first layer of the first Zener diode comprises a P-type region. Note however that if a third Zener diode is formed above the second Zener diode, the second layer of the second Zener diode may comprise a degenerate N-type region, and the first layer of the third Zener diode may comprise a degenerate P-type region, and so on for additional diodes in the stack.

In some embodiments, the first layer of the second Zener diode comprises a degenerate N-type region and the second layer of the first Zener diode comprises a degenerate P-type region. The second layer of the second Zener diode comprises a P-type region and the first layer of the first Zener diode comprises a N-type region. Note however that if a third Zener diode is formed above the second Zener diode, the second layer of the second Zener diode may comprise a degenerate P-type region, and the first layer of the third Zener diode may comprise a degenerate N-type region, and so on for additional diodes in the stack.

In one approach, a method for producing a Zener diode is performed.

Figure 1:
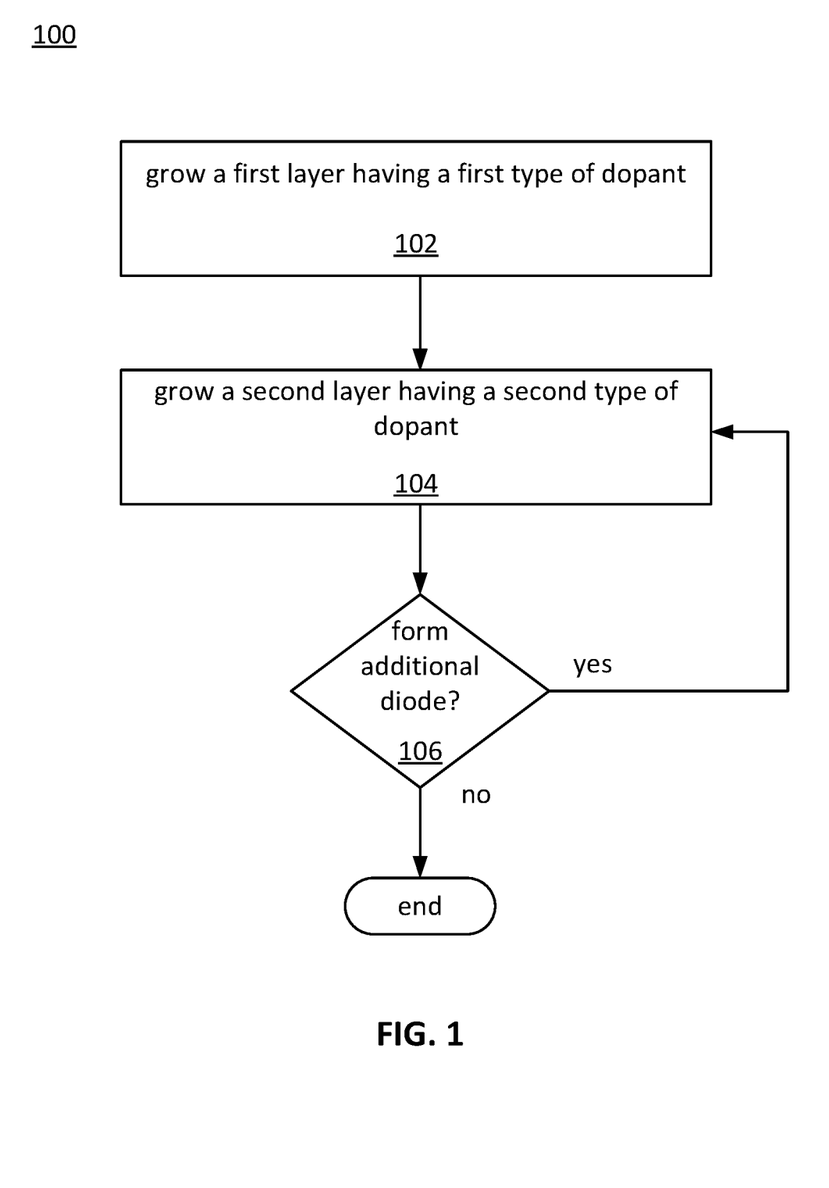
FIG. 1 is flowchart depicting a process for producing a plurality of multi-layer diodes, in accordance with an exemplary embodiment.

FIG. 1 is flowchart depicting a process 100 for producing a plurality of multi-layer diodes in accordance with an exemplary embodiment. By way of example only, the steps in the process 100 are described with reference to Zener diodes. This has been done by way of example only, and it should be understood that the process 100 may be used to produce the other types of diodes described herein.

Accordingly, as an option, the present process 100 may be implemented to construct structures such as those shown in the other FIGS. Moreover, this process 100 and others presented herein may be used to form structures for a wide variety of devices and/or purposes, which may or may not be related to the illustrative embodiments listed herein. Further, the processes presented herein may be carried out in any desired environment. Moreover, more or less steps than those shown in FIG. 1 may be included in process 100, according to various embodiments. It should also be noted that any of the aforementioned features may be used in any of the embodiments described in accordance with the various methods.

The process 100 may be used to grow a single Zener diode, or steps repeated to grow a stack of Zener diodes. The process 100 includes growing a first layer having a first type of electrically active dopant. See step 102. A second layer is grown in step 104, the second layer having a second type of electrically active dopant that is opposite to the first type of dopant. At decision 106, if another diode is to be fabricated, the process returns to step 102; else the process ends.

The bulk material of each layer is preferably a semiconductor such as silicon or other conventional semiconductor material. All of the layers may be formed of the same semiconductor, or the semiconductor material may be different in one or more of the layers. The layers may be grown by conventional processing techniques, but modified as set forth herein to achieve a sharp and narrow junction.

The layers may be grown epitaxially on a substrate, such as a silicon wafer. A conventional seed layer may be present on the substrate to define the epitaxial growth.

The first type of dopant may be P-type dopant while the second type of dopant is N-type dopant. Alternatively, the first type of dopant may be N-type dopant while the second type of dopant is P-type dopant. Any conventional dopants may be used, including those listed elsewhere herein.

One or both of the layers may also include an electrically inactive co-dopant. The layers may contain the same electrically inactive co-dopant, or different electrically inactive co-dopants. In preferred embodiments, the growing is performed by epitaxial growth using a conventional technique such as a chemical vapor deposition (CVD) process (e.g., atmospheric CVD, plasma-enhanced CVD, etc.), modified to conform to the teachings herein. In a CVD process, the dopant(s) can be introduced with the loop gases, whereby the dopant is thus incorporated into the layer during formation.

Doping levels of electrically active and electrically inactive dopants may be as described herein.

The co-doping of electrically active and electrically inactive dopants in the layers adjacent a junction reduces the tendency of the electrically active dopants to migrate across the junction, thereby enabling creation of sharp, narrow junctions, as well as allowing growth at higher temperatures than conventional processes, as higher temperatures generally result in higher quality films and/or faster deposition rates. The resulting suppression of dopant migration is particularly useful for silicon devices, as the growth temperature is typically higher than 1000° C. and the growth time is on the order of hours.

In an exemplary aspect, a method for producing a stack of diodes with tunnel junctions between adjacent diodes is disclosed. The method may include determining a number of diodes to create in the stack of diodes. The number of diodes grown in the stack is not limited to any particular number, and so can be 2, 3, 5, 10, 20 or more.

The method includes growing, for each diode, a first layer having a first type of electrically active dopant, and a second layer having a second type of electrically active dopant that is opposite to the first type of dopant. If needed for the type of diode being created, a third layer (e.g., intermediate layer) may be formed at a location between the first and second layer to form a region with at least ten times lower concentration of dopants compared to adjacent layers thereto. The method also includes repeating the growing until the number of diodes per stack are completed. The second layer of a first diode and the first layer of an adjacent, second diode are degenerate to form a tunneling diode at an interface of the first diode and the second diode. At least some of the layers include an electrically inactive co-dopant. The layers may contain the same electrically inactive co-dopant, or different electrically inactive co-dopants.

In preferred embodiments, the growing is performed by epitaxial growth using a conventional technique such as a CVD process, modified to conform to the teachings herein. In a CVD process, the dopant(s) can be introduced with the loop gases, whereby the dopant is thus incorporated into the layer during formation.

Doping levels of electrically active and electrically inactive dopants may be as described elsewhere herein.

The co-doping of electrically active and electrically inactive dopants in the layers adjacent a junction reduces the tendency of the electrically active dopants to migrate across the junction, thereby enabling creation of sharp, narrow junctions, as well as allowing growth at higher temperatures, which assists in epitaxial growth.

In some embodiments, the method further includes adjusting a doping concentration of the electrically active dopant in the second layer of the first diode and a doping concentration of the electrically active dopant in the first layer of the second diode from a first concentration level to a second concentration level, thereby creating a gradient of dopant concentration. In some embodiments, adjusting the doping concentration comprises adjusting the doping concentration of the second layer of the first diode and the doping concentration of the first layer of the second diode to gradually approach a concentration level that is substantially equal to a doping concentration level of the intermediate layer (if present).

In one approach, to create a stack of Zener diodes, the method may then include repeating the growing steps noted above for forming additional Zener diodes until the desired number of Zener diodes are completed. The second layer of a first Zener diode and the first layer of an adjacent, second Zener diode may be degenerate to form a tunneling diode at an interface of the first Zener diode and the second Zener diode.

In another exemplary approach, a method for producing a stack of diodes is disclosed. The method includes determining a number of Drift Step Recovery Diodes (DSRDs) in the stack of diodes, and growing, for each DSRD, a first layer having a first type of dopant, an intermediate layer forming a region with at least ten times lower concentration of dopants compared to adjacent layers thereto, and a second layer having a second type of dopant that is opposite to the first type of dopant. The method also includes repeating the growing until the number of DSRDs are completed. In some approaches, the second layer of a first DSRD and the first layer of an adjacent, second DSRD are degenerate to form a tunneling diode at an interface of the first DSRD and the second DSRD. The tunneling diode may demonstrate a linear current-voltage characteristic.

Figure 2:
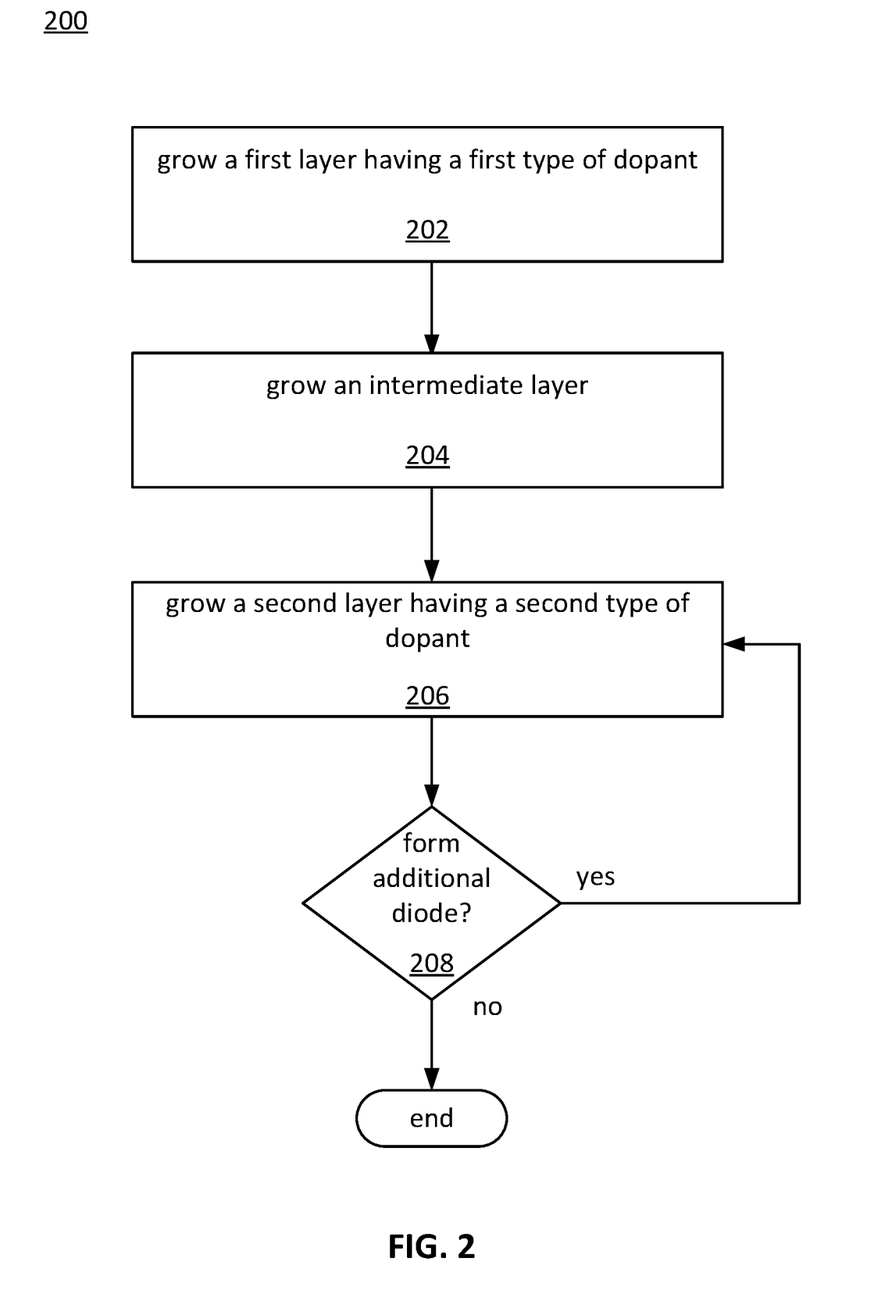
FIG. 2 is flowchart depicting a process for producing a plurality of multi-layer diodes, in accordance with an exemplary embodiment.

FIG. 2 is flowchart depicting a process 200 for producing a plurality of multi-layer diodes in accordance with an exemplary embodiment. By way of example only, the steps in the process 200 are described with reference to DSRDs. This has been done by way of example only, and it should be understood that the process 200 may be used to produce the other types of diodes described herein, such as Zener diodes.

Accordingly, as an option, the present process 200 may be implemented to construct structures such as those shown in the other FIGS. Moreover, this process 200 and others presented herein may be used to form structures for a wide variety of devices and/or purposes, which may or may not be related to the illustrative embodiments listed herein. Further, the processes presented herein may be carried out in any desired environment. Moreover, more or less steps than those shown in FIG. 2 may be included in process 200, according to various embodiments. It should also be noted that any of the aforementioned features may be used in any of the embodiments described in accordance with the various methods.

The process 200 includes forming a first of the diodes, e.g., DSRDs, by growing a first layer having a first type of dopant (202), growing an intermediate layer forming an intrinsic region (204), and growing a second layer having a second type of dopant that is opposite to the first type of dopant (206). At decision 208, if the desired number of devices per stack have not been fabricated, steps 202-206 are repeated. Once the desired number of devices have been formed in a stack, the fabrication process can be terminated.

The bulk material of each layer is preferably a semiconductor such as silicon or other conventional semiconductor material. All of the layers may be formed of the same semiconductor, or the semiconductor material may be different in one or more of the layers. The layers may be grown by conventional processing techniques, but modified as set forth herein to achieve a sharp and narrow junction.

The layers may be grown epitaxially on a substrate, such as a silicon wafer. A conventional seed layer may be present on the substrate to define the epitaxial growth.

The first type of dopant may be P-type dopant while the second type of dopant is N-type dopant. Alternatively, the first type of dopant may be N-type dopant while the second type of dopant is P-type dopant. Any conventional dopants may be used, including those listed elsewhere herein.

It should be noted that while the term "intrinsic region" as used herein typically refers to an undoped region, the region that is positioned between the two doped regions does not need to be an undoped intrinsic region, but rather it may be a region with a considerably lower doping concentration, such as at least 10 times lower dopant concentration, compared to its adjacent layers.

In addition, the process 200 can further include doping the layers positioned at the interface of two diodes to create a tunneling diode. Continuing with the DSRD example, because the first type and the second type of dopant are opposite to each other, the second layer of the first DSRD (e.g., P-type dopant) and the first layer of the second DSRD (e.g., N-type dopant) would form a P-N junction diode. However, additional doping at the interface can change the P-N junction diode to a tunneling diode that demonstrates a linear current-voltage characteristic. The tunneling diode can thus behave more like a metal, thereby eliminating the need to introduce a metallic layer and any undesired voids between the DSRDs. In some embodiments, the tunneling diode has an average doping concentration of the electrically active dopant in one or more layers of at least $1\times10^{18}$ cm$^{-3}$ and preferably higher than $5\times10^{19}$ cm$^3$ (atoms per cubic centimeter).

In a preferred aspect, the junction at the interface of the two diodes is further sharpened and narrowed by co-doping one or both of the layers at the interface with at least one electrically active dopant and at least one electrically inactive dopant. Any conventional, electrically active P-type and/or N-type dopant may be used. Illustrative electrically active P-type dopants include boron, aluminum and gallium. Illustrative electrically active N-type dopants include phosphorous, arsenic and antimony. The electrically inactive co-dopant, in the case of silicon-based semiconductors, may be any group IV element besides silicon, with carbon and germanium being preferred. Other group dopants may be used if they meet both requirements: electrically inactive and reduction of diffusivity of the electrically active dopant. Moreover, combinations of each type of dopant may be used in some approaches, e.g., both carbon and germanium. For germanium-based semiconductors, carbon is preferred as the electrically inactive co-dopant. Addition of co-dopants can be achieved using any conventional doping process.

In exemplary approaches, co-growth, co-implantation, and co-diffusion of carbon and/or germanium with either phosphorous or boron decreases the diffusion of the electrically active dopant in silicon. Both germanium and carbon are in Group IV of the periodic table with silicon, meaning they do not readily form electrically active dopants. Without wishing to be bound by any particular theory, carbon and germanium are believed to affect the makeup of point defects in silicon, thereby changing the diffusion properties of other dopants in the material. This effect is especially pronounced with ion implantation of both carbon or germanium and an electrically active dopant. The co-dopants are believed to reduce the dopant tail created during the activation anneal, allowing narrower doped regions to form. It is believed that up to an almost 20× reduction in diffusivity of boron co-doped with carbon can be achieved in layers grown via molecular beam epitaxy and annealed at high temperatures. Thus, co-doping is extremely effective at inhibiting diffusion so that narrow junctions can be grown via epitaxy to build monolithic devices that require tunneling.

In some embodiments, the tunneling diode has an average doping concentration of the electrically inactive dopant in one or more layers of at least $1 \times 10^{19}$ cm$^{-3}$ and preferably higher than $1 \times 10^{20}$ cm$^{-3}$.

In some embodiments, the step of doping of the interface regions comprises adjusting a doping concentration of the first type dopant, the doping concentration of the second type dopant (electrically active dopant), and/or the doping concentration of the electrically inactive dopant across the thickness of the respective layer. The concentration can be adjusted from a first concentration level (e.g., a peak concentration) to a second concentration level, e.g., to form a gradient of doping concentration in the layer thickness direction (perpendicular to the plane of deposition). In some embodiments, adjusting the doping concentration comprises adjusting the doping concentration of the second layer of the first diode and the doping concentration of the first layer of the second diode to gradually approach a second concentration level that is substantially equal to the doping concentration level of the intermediate layer (if present).

In some embodiments, after the doping, the tunneling diode can achieve a reverse breakdown voltage equal to or lower than 200 meV. In some embodiments, the process further includes introducing one or more defects to the tunneling diode to allow a current to flow through the tunneling diode regardless of a bias polarity.

The processes 100 and 200 as shown in FIGS. 1 and 2 greatly simplify the fabrication of diodes such as DSRDs and Zener diodes, and such diodes provide superior performance to those created via prior techniques, as the stack is essentially monolithic without any voids, whereas similar devices produced via prior techniques have voids introduced during the bonding thereof.

Figure 3:
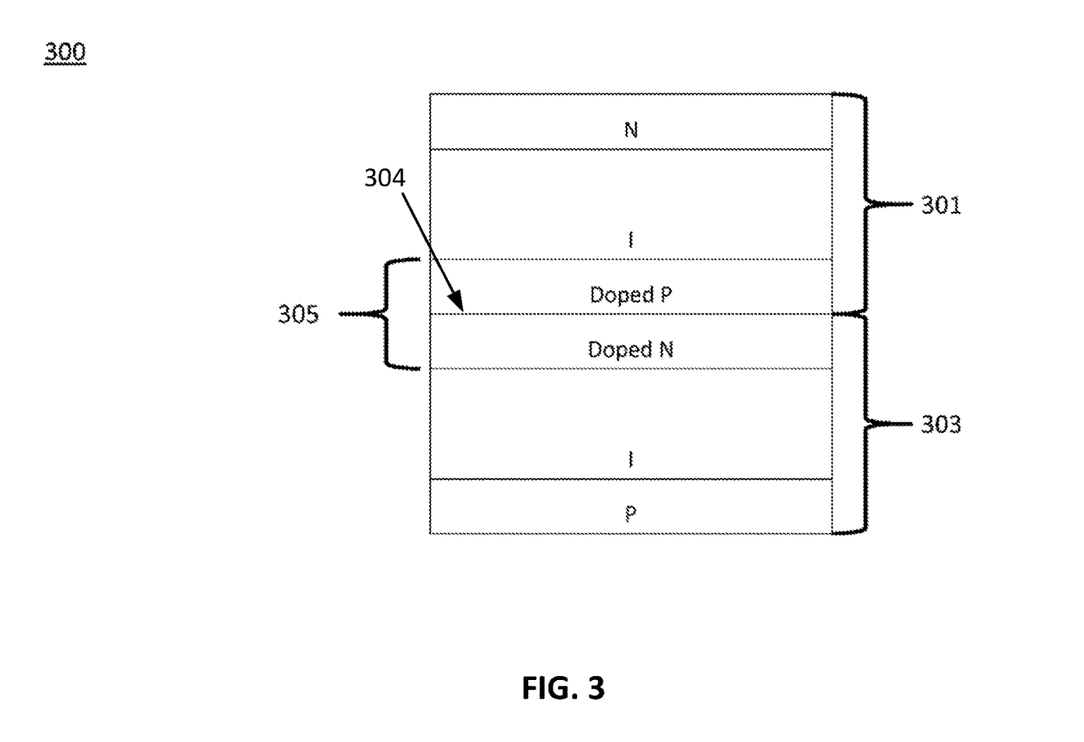
FIG. 3 is a drawing of an exemplary structure of a stack of diodes, in accordance with one embodiment.

FIG. 3 illustrates an exemplary structure of a stack of diodes 300 (e.g., DSRDs) in accordance with one embodiment of the present invention. As an option, the present stack 300 may be implemented in conjunction with features from any other embodiment listed herein, such as those described with reference to the other FIGS. Of course, however, such stack 300 and others presented herein may be used in various applications and/or in permutations which may or may not be specifically described in the illustrative embodiments listed herein. Further, the stack 300 presented herein may be used in any desired environment.

The depicted stack 300 is a structure with two DSRDs for illustration purposes, it being understood that the structure can be modified to include additional DSRDs as needed. As described above, the stack 300 can be produced by growing the entire stack epitaxially on a substrate, such as a wafer. In this example, the stack 300 comprises two DSRDs (301 and 303). Each DSRD includes a P-region, an I-region, and an N-region. The DSRDs can be arranged as P/I/N/P/I/N/ . . . or alternatively as N/I/P/N/I/P/ . . . so that two opposite regions (N/P or P/N) are in contact with each other at the interface 304 between two DSRDs. The adjacent opposite regions are each heavily doped with one or more electrically active dopants to form a tunneling diode 305. Moreover, the adjacent opposite regions are each heavily doped with one or more electrically inactive dopants to create a sharp and narrow junction.

In some approaches, heavy doping of the tunneling diode creates degenerate regions such that the tunneling diode demonstrates a linear current-voltage characteristic (that is, it can behave more like a metal rather than a semiconductor).

In some embodiments, each layer in the tunneling diode has an average doping concentration of electrically active dopant in a range from $1 \times 10^{18}$ cm$^{-3}$ to $1 \times 10^{20}$ cm$^3$. In some embodiments, the average doping concentration is preferably higher than $5 \times 10^{19}$ cm$^3$. In some embodiments, the reverse breakdown voltage of the tunneling diode is around 200 meV or lower. The lower breakdown voltage allows for a minor increase in the total turn on voltage of the DSRD in forward bias. For example, each DSRD can turn on at around 700 meV (e.g., 650 meV to 750 meV) and each tunneling diode can break down at much lower voltage than 700 meV (e.g., 180 meV to 250 meV). Because there is no void at the interface of two adjacent DSRDs, the resulting multi-layer DSRDs offers superior performance as compared to conventional DSRDs.

Figure 4:
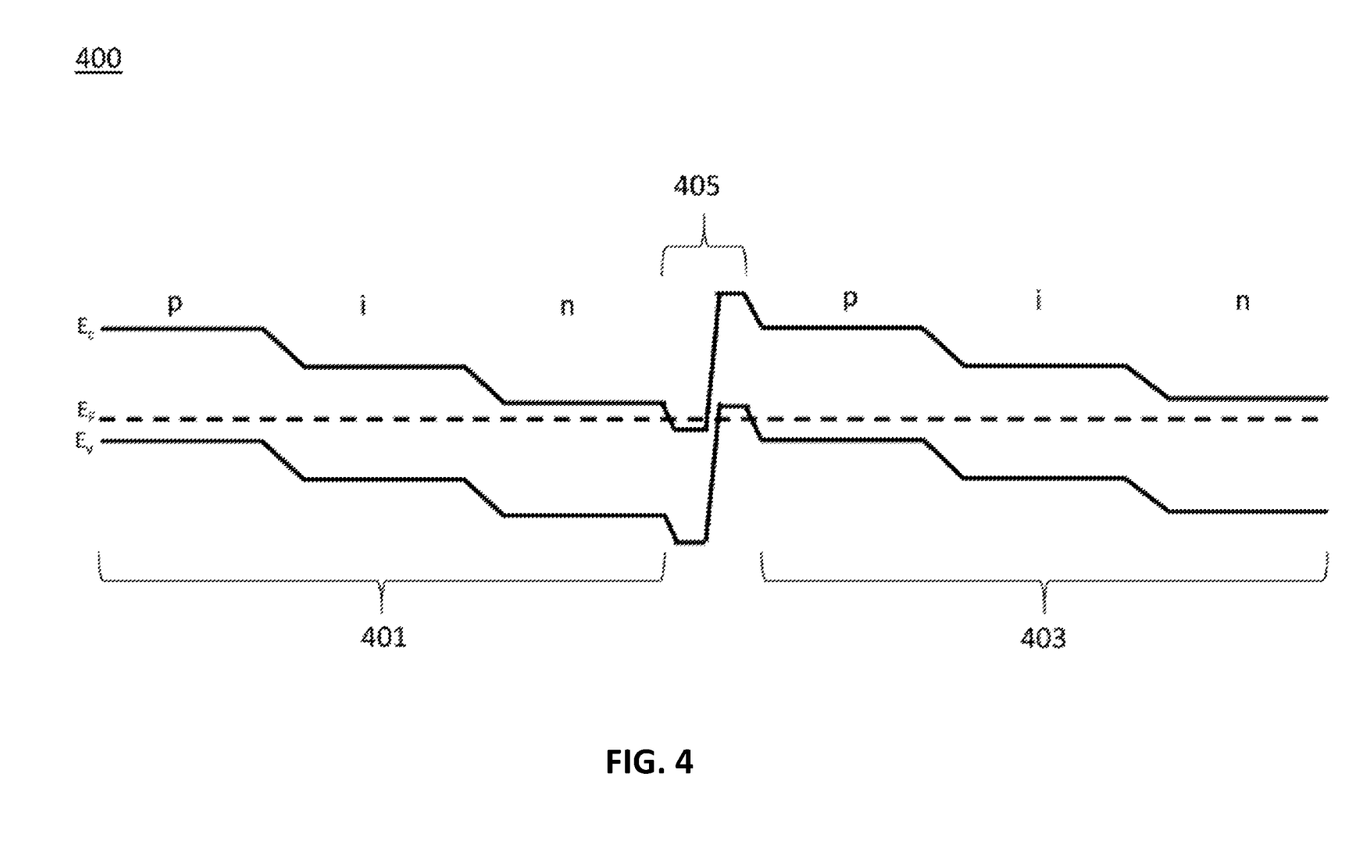
FIG. 4 is an exemplary band diagram of a stack of diodes, in accordance with one embodiment.

FIG. 4 illustrates an exemplary band diagram 400 of a stack of diodes in accordance with one embodiment. The depicted band diagram shows energy bands of two DSRDs for illustration purposes, it being understood that the structure can be modified to include additional DSRDs as needed. As shown in FIG. 4, P-regions, I-regions, and N-regions of the first DSRD 401 and the second DSRD 403 exhibit an energy gap between the conduction band edge, denoted as Ec, and the valence band edge, denoted as Ev. The Fermi energy level, denoted as Ef, is illustrated by the dotted line. In the section of the figure designating the tunneling diode 405, at the interface of the two DSRDs 401 and 403, the valance and conduction bands overlap each other, allowing operation with a reverse breakdown voltage that is 200 meV or lower.

Figure 5:
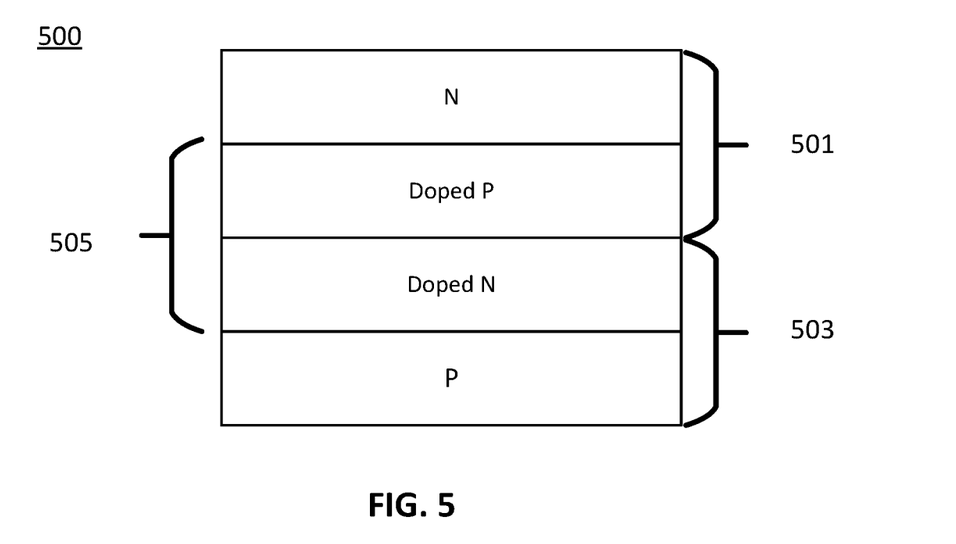
FIG. 5 is a drawing of an exemplary structure of a stack of diodes, in accordance with one embodiment.

FIG. 5 illustrates an exemplary structure of a stack of diodes 500 (e.g., Zener diodes) in accordance with one embodiment.

As an option, the present stack 500 may be implemented in conjunction with features from any other embodiment listed herein, such as those described with reference to the other FIGS. Of course, however, such stack 500 and others presented herein may be used in various applications and/or in permutations which may or may not be specifically described in the illustrative embodiments listed herein. Further, the stack 500 presented herein may be used in any desired environment.

The depicted stack 500 is a structure with two Zener diodes for illustration purposes, it being understood that the structure can be modified to include additional Zener diodes as needed. Moreover, various aspects include a single diode having features described herein, e.g., a Zener diode created using the novel process noted below.

The stack 500 can be produced by growing the entire stack epitaxially on a substrate, such as a wafer. In this example, the stack 500 comprises two Zener diodes (501 and 503). Each Zener diode includes a P-region and an N-region. The Zener diodes can be arranged as P/N/P/N/ . . . or alternatively as N/P/N/P/ . . . so that two opposite regions (N/P or P/N) are in contact with each other at the interface between two diodes. The adjacent opposite regions are each heavily doped with one or more electrically active dopants to form a tunneling diode 505. Moreover, the adjacent opposite regions are each heavily doped with one or more electrically inactive dopants to retain the sharp and narrow junction.

In use, the processes described herein enable epitaxial growth of low voltage monolithic tunnel diodes, Zener diodes, tunneling drift step recovery diodes, and other tunneling devices. Moreover, the processes described herein enable epitaxial growth of stack of diodes.

The resulting structures may be used in any application, circuit, device, etc. where such a diode or device provides a desired effect.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A structure, comprising:
    a first diode, comprising:
        a first layer having a first type of dopant, and
        a second layer above the first layer, the second layer having a second type of dopant and a first electrically inactive co-dopant,
        wherein an average concentration of the first electrically inactive co-dopant is at least $1 \times 10^{19}$ cm$^{-3}$,
        wherein the first type of dopant of the first layer is one of either a P-type or an N-type and the second type of dopant of the second layer is the other one of either the P-type or N-type; and
    a second diode formed directly on the first diode, the second diode comprising:
        a first layer having a third type of dopant and a second electrically inactive co-dopant, and
        a second layer above the first layer of the second diode, the second layer of the second diode having a fourth type of dopant,
        wherein the third type of dopant of the first layer is one of either a P-type or an N-type and the fourth type of dopant of the second layer is the other one of either the P-type or N-type.

2. The structure as recited in claim 1, wherein the first and third types of dopants are the same electrically active dopant, wherein the second and fourth types of dopants are the same electrically active dopant.

3. The structure as recited in claim 1, wherein the first and third types of dopants are different electrically active dopants.

4. A structure, comprising:
    a first diode, comprising:
        a first layer having a first type of dopant, and
        a second layer above the first layer, the second layer having a second type of dopant; and
    a second diode formed directly on the first diode, the second diode comprising:
        a first layer having a third type of dopant, and
        a second layer above the first layer of the second diode, the second layer of the second diode having a fourth type of dopant,
        wherein the second layer of the first diode includes a first electrically inactive co-dopant, wherein the first layer of the second diode includes a second electrically inactive co-dopant,
        wherein an average concentration of the second electrically inactive co-dopant is at least $1 \times 10^{19}$ cm$^{-3}$.

5. The structure as recited in claim 4, wherein an average concentration of the first electrically inactive co-dopant is at least $1 \times 10^{19}$ cm$^{-3}$.

6. The structure as recited in claim 1, wherein all of the layers have physical characteristics of epitaxial growth.

7. The structure as recited in claim 1, wherein the first layer of the second diode and the second layer of the first diode are degenerate thereby forming a tunneling diode at an interface of the first diode and the second diode.

8. The structure as recited in claim 7, wherein the tunneling diode has a reverse breakdown voltage equal to or lower than 200 me V.

9. A structure, comprising:
    a first diode, comprising:
        a first layer having a first type of dopant, and
        a second layer above the first layer, the second layer having a second type of dopant and a first electrically inactive co-dopant,
        wherein an average concentration of the first electrically inactive co-dopant is at least $1 \times 10^{19}$ cm$^{-3}$,
        wherein the first type of dopant of the first layer is one of either a P-type or an N-type and the second type of dopant of the second layer is the other one of either the P-type or N-type; and
    a second diode formed directly on the first diode, the second diode comprising:
        a first layer having a third type of dopant and a second electrically inactive co-dopant, and
        a second layer above the first layer of the second diode, the second layer of the second diode having a fourth type of dopant,
        wherein each diode includes a doped intermediate layer, wherein a concentration of the dopant in the respective intermediate layer is at least ten times lower relative to concentrations of dopants in layers directly adjacent thereto.

10. The structure as recited in claim 1, wherein at least one of the layers has a gradient in dopant concentration along a thickness direction thereof.

11. The structure as recited in claim 1, wherein average doping concentrations of the dopants in the first layer of the first diode and the second layer of the second diode are in a range from $1 \times 10^{18}$ cm$^{-3}$ to $1 \times 10^{20}$ cm$^{-3}$.

12. The structure as recited in claim 1, comprising a third diode formed directly on the second diode, the third diode comprising:
    a first layer having a fifth type of dopant, and
    a second layer above the first layer of the third diode, the second layer of the third diode having a sixth type of dopant that is opposite to the fifth type of dopant.

13. The structure as recited in claim 1, wherein the diodes are Zener diodes.

14. The structure as recited in claim 1, wherein the diodes are drift step recovery diodes.

15. A process for forming the structure as recited in claim 1, the process comprising:
    forming the first diode by growing the first layer of the first diode and growing the second layer of the first diode above the first layer; and forming the second diode above the first diode by growing the first layer of the second diode and growing the second layer of the second diode above the first layer of the second diode.

16. The process as recited in claim 15, comprising adding an electrically inactive co-dopant to the layer of each diode that is adjacent another of the diodes.

17. The process as recited in claim 15, wherein a tunneling diode is formed at an interface between the first and second diodes.

18. The process as recited in claim 15, comprising forming a doped intermediate layer between the first and second layers of each diode, the intermediate layers having an at least ten times lower concentration of dopant relative to adjacent layers thereto.

19. The structure as recited in claim 1, wherein the first type of dopant is a P-type dopant, wherein the second type of dopant is an N-type dopant.

20. The structure as recited in claim 1, wherein the first type of dopant is an N-type dopant, wherein the second type of dopant is a P-type dopant.

\* \* \* \* \*